(12) United States Patent
Joodaki

(10) Patent No.: US 7,674,988 B2
(45) Date of Patent: Mar. 9, 2010

(54) SHIELDED CIRCUIT BOARD AND METHOD FOR SHIELDING A CIRCUIT BOARD

(75) Inventor: Mojtaba Joodaki, München (DE)

(73) Assignee: Qimonda AG, Munich (DE)

( * ) Notice: Subject to any disclaimer, the term of this patent is extended or adjusted under 35 U.S.C. 154(b) by 750 days.

(21) Appl. No.: 11/502,627

(22) Filed: Aug. 11, 2006

(65) Prior Publication Data

US 2008/0035369 A1    Feb. 14, 2008

(51) Int. Cl.
*H01R 12/04*    (2006.01)
*H05K 1/11*    (2006.01)
*H05K 3/02*    (2006.01)
*H05K 3/10*    (2006.01)

(52) U.S. Cl. .................. 174/261; 361/792; 29/846
(58) Field of Classification Search ............... 174/251, 174/261; 361/792–795; 29/846–853
See application file for complete search history.

(56) References Cited

U.S. PATENT DOCUMENTS

| 4,758,922 A | * | 7/1988 | Ishigaki et al. | 361/330 |
| 6,617,527 B2 | * | 9/2003 | Ozeki et al. | 174/261 |
| 6,777,620 B1 | * | 8/2004 | Abe | 174/255 |

\* cited by examiner

*Primary Examiner*—Jeremy C Norris
(74) *Attorney, Agent, or Firm*—Edell, Shapiro & Finnan, LLC

(57) ABSTRACT

A shielded circuit board includes a first metal layer with a first surface area, and first and second portions. A second metal layer includes first and second surface areas. At least one signal transmission line is arranged in a first dielectric material, the first dielectric material separating the first portion of the first metal layer and a first portion of the second metal layer. The first surface area of the first metal layer is arranged on the first portion facing the first surface area of the second metal layer and is arranged on the second portion facing the second surface area of the second metal layer. A method relates to shielding a circuit board.

27 Claims, 4 Drawing Sheets

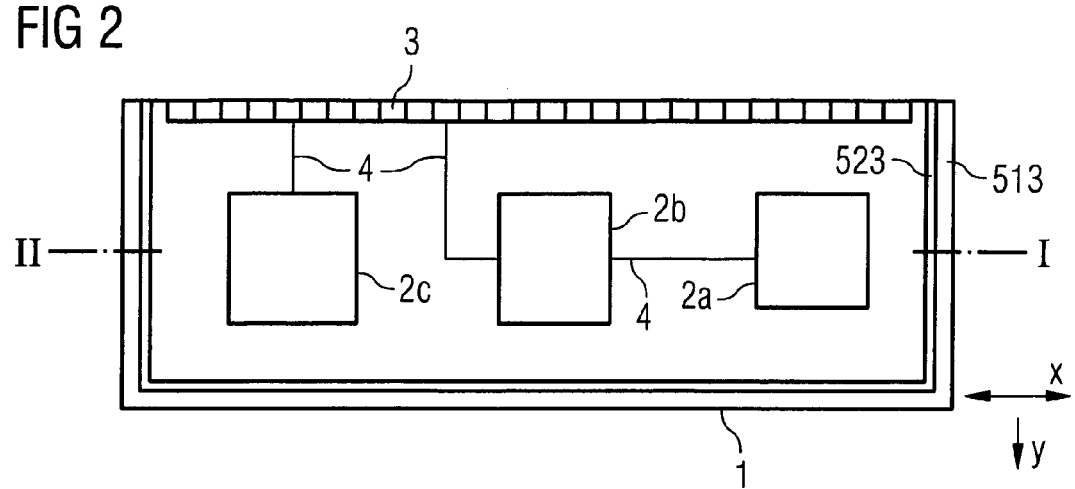
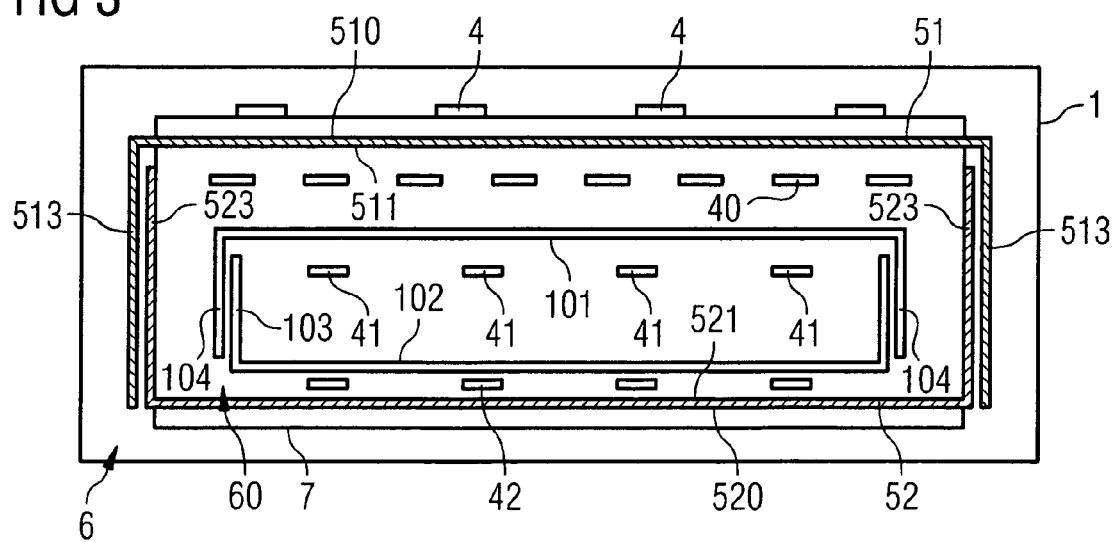

SHIELDED CIRCUIT BOARD AND METHOD FOR SHIELDING A CIRCUIT BOARD

FIELD OF INVENTION

The invention relates to a shielded circuit board and a method for shielding a circuit board.

BACKGROUND

Modern electronic devices often include one or more integrated circuit chips, which perform different applications and may communicate with each other to exchange different signals. Normally, the integrated circuit chips are mounted on a special board that provide supply and power lines to the circuits and signal lines for data exchange between the different circuit chips. These boards, called circuit boards or also referred to as printed circuit boards, may comprise one or more layers including one or more power and transmission lines. As the number of integrated circuit chips per board and the amount of a data communicated between these chips continues to increase, the number of layers of circuit boards also rises up. For example, modern circuit boards may comprise 4, 6, 10 or even more different layers.

Typically, such circuit boards can be used for different applications. For example, a motherboard of a computer system includes integrated circuit chips used for controlling the memory interface and input/output interfaces such as, i.e., USB, parallel and serial interfaces, as well as network devices such as, i.e., Ethernet or IEEE 801.11. A further example for a circuit board is a memory module, comprising a number of memory chips, i.e., RAM, ROM, Flash or EPROM memory. The memory chips are mounted on the board and connected to a contact bank of the module.

However, as the signal processing of the integrated circuit chips increase, electromagnetic emission radiated by the transmission or power lines within the circuit board may become an issue. Such emission, as seen in FIG. 5, is radiated as electromagnetic energy in each direction. The unintentional generation and propagation of energy can be received by a second device, thereby interfering with the device and causing unwanted effects. Such process is called EMI for electromagnetic interference. Consequently, countermeasures should be taken in order to avoid the propagation of such energy towards the external environment. Hence, there is a need for suppressing the emission of unwanted electromagnetic energy from a circuit board.

SUMMARY

The invention provides a shielded circuit board, which reduces the electromagnetic radiation generated by transmission lines within the shielded circuit board. Furthermore, the proposed structure provides a very effective decoupling capacitor beyond the frequency of 1 GHz. Accordingly, the present invention provides a very effective power integrity decoupling at high frequencies which can be of interest for high speed applications.

The invention also relates to a method for shielding a circuit board, suppressing the electromagnetic emission radiated from at least one transmission line within the shielded circuit board. This method may be of use in applications, in which high-speed data transmission in the range of some hundred MHz up to some GHz is of some concern.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIG. 2 shows a block diagram illustrating the top view of an embodiment of a shielded circuit board according to the present invention.

FIG. 3 shows a block diagram illustrating a second possible embodiment of a shielded circuit board according to the present invention.

DETAILED DESCRIPTION

Figure 1:
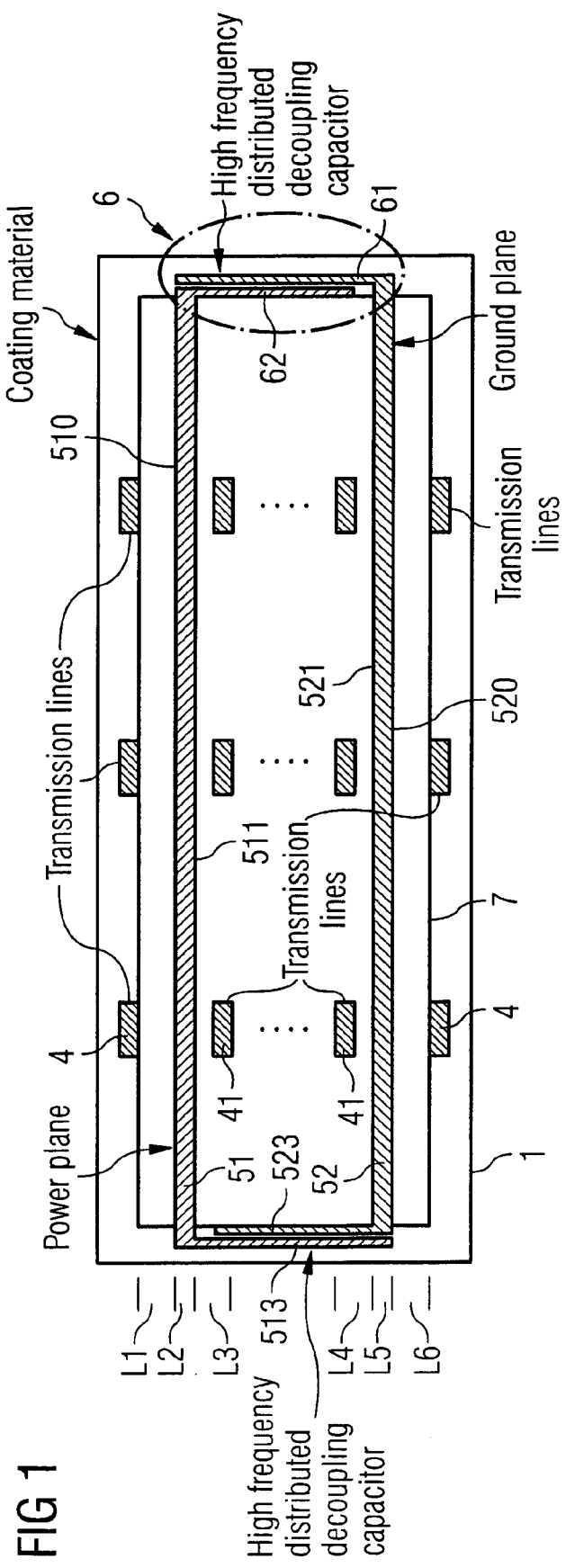
FIG. 1 shows a block diagram illustrating a first embodiment of a shielded circuit board according to the present invention.

In the following description further aspects and embodiments of the present invention are summarized. In addition, a reference is made to the accompanying drawings, which form a part hereof, and in which is shown by way of illustration, in which the invention may be practiced. In this regard, directional terminology such as top, bottom surface area, left and right side, etc. is used with reference to the orientation of the figures being described. The directional terminology used for purposes of illustration is in no way limiting, because the embodiments can be positioned in different orientations.

The embodiments of the drawings present a summary in order to provide a better understanding of one or more aspects of the present invention. This summary is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

The term dielectric or dielectric material refers to a substance that is resistant to the flow of an electric current. For example, an electrical insulator is considered to be a dielectric material. The term dielectric constant refers to a measure of the extent to which a substance concentrates the electrostatic lines of flux. More specifically, it is the ratio of the amount of electrical energy stored in an insulator, when a static electric field is imposed across it, relative to vacuum (which has a dielectric constant of 1). Thus, the dielectric constant is also known as the static permittivity.

In one aspect of the present invention, the shielded circuit board comprises a first metal layer having a first surface area, the first metal layer further comprising first portions and second portions. The circuit board also comprises a second metal layer having a first surface area and a second surface area. At least one signal transmission line is provided, the transmission line being arranged in a dielectric material. The dielectric material separates the first portion of the first metal layer and the first portion of the second metal layer. Consequently, the first portions of the first metal layer and the second metal layer comprise a first distance to each other. The first surface area of the first metal layer is being arranged in the first portion facing the first surface area of the second metal layer. In the second portion the first surface area of the first metal layer is being arranged facing the second surface area of the second metal layer. According to one aspect of the invention, the surface areas of the respective metal layers are facing each other in a second distance.

With the structure and the two different portions of the first metal layer some kind of encasement is provided, thereby suppressing the emission of electromagnetic energy from the at least one signal transmission line. More particularly, the first portion of the first metal layer facing the first surface of the second metal layer can suppress emission radiated by the at least one signal transmission line perpendicular to the first portion of the first metal layer. The second portion of the first metal layer, on which the first surface area faces the second surface area of the second metal layer provides a decoupling capacitor and suppresses the electromagnetic energy emitted by the transmission line substantially planar to the first portion of the first metal layer.

The capacitance of the decoupling capacitor is dependant of the distance between the surfaces of the first and second metal layer. For a better decoupling, particularly for high-frequency application, the distance between the surfaces should be much smaller than the distance between the first portions of the respective layers.

In a further aspect of the invention, the dielectric material forms a body having at least one side surface and two main surfaces. The body may comprise two main surfaces areas and a sidewall, having for example four side surface areas. A first metal layer having a first portion is arranged with its first portion on a first main surface of the dielectric material. A second metal layer is arranged on the second main surface. At least one signal transmission line is provided in the dielectric material between the first portions of the first and second metal layer. The second portion of the first metal layer is disposed at least partly across the at least one side surface of the body and the dielectric material respectively. The second portion of the second metal layer is being disposed non-conductively at least partly across the second portion of the first metal layer.

Thereby some kind of capacitor is formed by second portions of the first and second metal layer. Accordingly, the first portions of the first and second metal layer arranged on the main surface of the dielectric material also form a capacitor having a first capacitance. It is to be understood, that due to the different distance between the first portions and the second portions of each metal layer different capacitance values in those areas are achieved. Due to a very small distance between the second portions of the metal layers may be achieved thereby providing a very effective power-integrity decoupling.

According to the present invention, the new structure provides a good shielding in respect to radiated electromagnetic energy by one or more transmission lines and also a good distributed decoupling capacitor especially at the edges of a shielded circuit board and more particularly at the edges of the dielectric material of the layer of the shielded circuit board.

FIG. 2 shows a top view of a shielded circuit board of an embodiment of the present invention. Such a shielded circuit board may be, for example, a memory module, a memory card, or any other pluggable module. On the surface of module 1 a plurality of integrated circuit chips 2a, 2b and 2c are mounted. The chips 2a, 2b, 2c comprise a semiconductor material such as, i.e., silicon or gallium arsenide and the integrated circuits are disposed in the material and perform a specific application. For example, the integrated circuit chips 2a, 2b and 2c may comprise a plurality of memory cells including address logic for addressing the memory cells and sense amplifier for amplifying the charge stored in the cells. In another example, the integrated circuit chips may comprise a signal processing unit, i.e., a graphic processor, a network device processor or other application specific integrated circuits.

The different circuit chips 2a, 2b and 2c are coupled to each other and to a connector array 3 via a plurality of transmission lines 4. For illustration purposes, FIG. 2 shows three transmission lines 4. It is understood that module 1 may include a plurality of different transmission lines connecting the circuit chips to the connector array 3 and to each other. Module 1 also comprises supply lines. The supply lines connect the array 3 to the supply terminals of chips 2a, 2b and 2c for providing supply voltage and current to the integrated circuits.

As shown in FIG. 2, on the sidewalls of the module 1, namely the opposite side of the connector array 3 and on the left and right side respectively, two metal layers 523 and 513 are provided. These metal layers are separated with a small layer of dielectric material. Due to the two metal layers 523 and 513 the emission of electromagnetic energy from the transmission lines 4 within the module 1 substantially parallel to the connector array 3 is suppressed. This encasement prevents at least partly emission of energy from the lines 4 to external circuits and therefore reduces electromagnetic interference (EMI).

FIG. 1 shows an illustration of the embodiment according to the present invention along the section plan I-II of FIG. 2. For illustration purposes the integrated circuit chips are not shown herein. The shielded circuit board 1 comprises a coating material 6 enclosing a body 7 of the shielded circuit board as well as any transmission lines 4. The transmission lines 4 are arranged on top of the body 7 on the upper main surface as well as on the bottom main surface. The body 7 of the circuit board comprises layers L1 to L6 including a dielectric material.

In other words, the body 7 of the circuit board is provided by arranging different layers L1 to L6 on top of each other. Two of those layers L2, L5 comprise a metal layer that is disposed over the main surface of underling layers of body 7. The first metal layer 51 on L2, referred to as the power plane, comprises a first surface area 510 and a second surface area 511 in a first portion. The second metal layer L5, referred to as the ground plane comprises a first surface area 521 and a second surface area 520 in its first portion. The respective first portions are formed in body 7. As is shown, the first surface area of the respective metal layers within the body 7 face each other and are separated by layers L3, L4. In each of layers L3, L4, comprising the dielectric material, a plurality of transmission lines 41 is provided. Vias, through the metal layer (L2), provide connections between the transmission lines and the circuit chips.

The metal layer L2 is almost completely encased, on all sides, by the dielectric material of body 7. The dielectric material of layers L3 to L4 may be different from the dielectric material of layers L1 and L6. Of course, the body 7 may also comprise the same dielectric material in each layer. The distance between the transmission lines 4, on the top and bottom of body 7 of the shielded circuit board, to layers 51 and 52, which form the power and the ground plane respectively, is very small. Thereby, any emitted electromagnetic energy from the transmission lines 4, is very efficiently suppressed. The emitted energy from the transmission lines 41 perpendicular to layers L2, L5 is also suppressed by the power and ground plane.

For suppressing the emission, which radiates substantially parallel to layers L2, L5, the metal layers 51, 52 are disposed across the sidewall of body 7. More particularly, the first portion of metal layer 52 within the body 7 is in conductive connection to a second portion 523 of the metal layer on the left sidewall of body 7. The metal layer 51, forming the power plane within body 7, is disposed across the metal layer 523 along the sidewall, thereby forming a second portion 513. Between portions 523 and 513 a dielectric material is provided to prevent short circuits between the layers 51 and 52. Accordingly, the metal layer forming 51 the power plane is disposed across the sidewall on the right side forming a second portion 62 directly on top of the dielectric material of body 7. A small dielectric material separates a second portion 61 of the metal layer 52 from the portion 62. The second portions 61, 62 form a high-frequency distributed decoupling capacitor 6 and also suppress any emitted energy from the transmission lines 41 within body 7.

In other words, the surface area 511 of the first metal layer is facing the first surface area 521 of the second metal layer within the first portions of the metal layers 51, 52 forming the power and ground plane respectively. In the second portion, the first surface area 511 of a first metal layer is facing the second surface area 520 of the second metal layer.

While the distance between the metal layers within the first portion, forming power and ground plane may be in the range, i.e., of some hundred µm, the distance between the second portions, forming the decoupling capacitor may be in the range, i.e., of a few µm. For example, the distance may range from 1 µm to 10 µm. The conductive connection between the second portions on the sidewall of the body 7 and the power and ground plane respectively results in a very high overall capacitance, which provides good distributed decoupling and high power and signal integrity.

Figure 6:
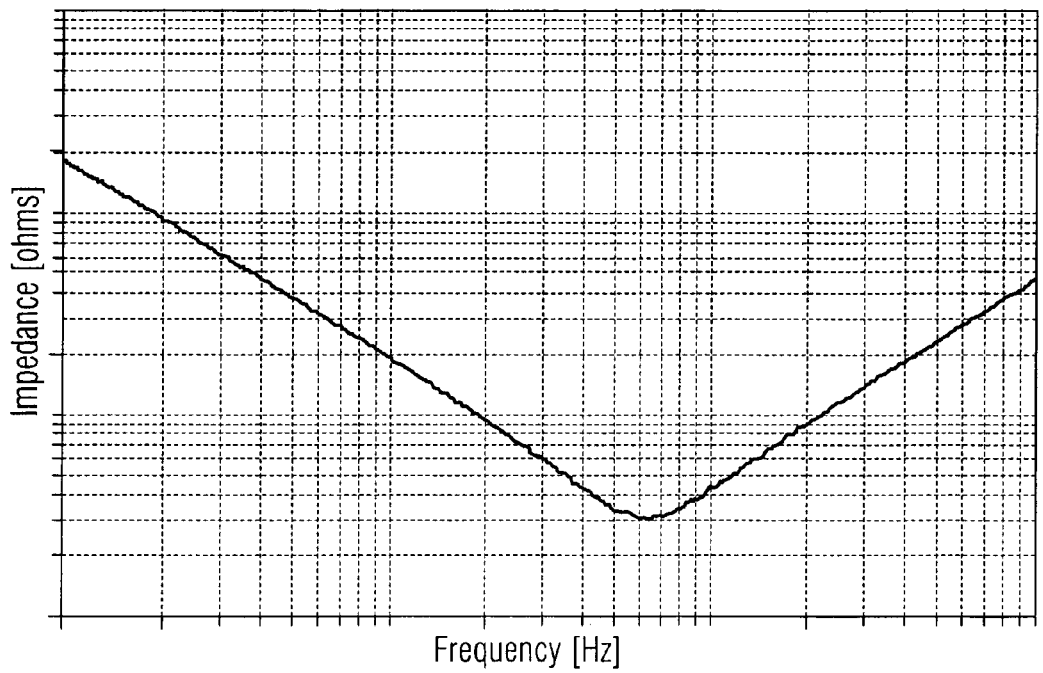
FIG. 6 shows a diagram of the impedance of a capacitor that is frequency dependent, thereby illustrating the aspects of providing a power-integrity decoupling effect.

FIG. 6 shows the impedance in dependence of the frequency of a capacitor. The minimum impedance is shifted to higher frequency if the capacitance increases. Due to the small distance between the layers the capacitance between the power and the ground plane is increased. Therefore, power and signal integrity is enhanced.

FIG. 3 shows a second embodiment of the present invention. As mentioned before, the shielded circuit board comprises a plurality of different layers including transmission and power supply line formed therein. To prevent radiation of electromagnetic energy, the transmission lines 41 are shielded on the top and bottom side with first portions 101, 102 of two metal layers. These shielding metal layers also comprise second portions 103, 104, which are substantially perpendicular to the first portions 101, 102. The structure encases the transmission lines 41. The second portions 103, 104 of each of the shielding layers are separated by dielectric material, thereby forming first decoupling capacitors. The first encasement of transmission lines 41 is completely surrounded by further dielectric material forming body 7 of the shielded circuit board.

Within the dielectric material additional transmission lines 40 and 42 are provided. To further suppress electromagnetic energy transmitted from the transmission lines 40, 42, a top shielding layer 51 and a bottom shielding layer 52 are arranged within the body 7 in the dielectric material. Third shielding layers 513 and fourth shielding layers 523 are arranged along the sidewall of the body 7. A dielectric material is provided between the third and fourth shielding layer thereby separating them, forming second decoupling capacitors.

Furthermore, the third shielding layer 513 is connected to the first shielding layer 51 on top of body 7, representing the power plane of the shielded circuit board. The fourth shielding layer 523 is connected to the bottom shielding layer 52 forming the ground plane. The third and fourth shielding layers 513, 523 are completely surrounded by the coating material 6 to protect the shielding layers from external environmental effects.

FIGS. 4A to 4D show a possible embodiment for shielding a shielded circuit board to suppress electromagnetic emission in each direction and to provide a better electronic decoupling and thereby a better signal and power integrity. In these simplified block diagrams only the top layer 51, forming the first shielding layer and the bottom metal layer 52 forming the second shielding layer are shown for illustration purposes.

The first surface 511 of the first shielding layer is facing the first surface area 521 of the second shielding layer 52. Both shielding layers are completely enclosed by a dielectric material, the dielectric material forming the body 7 of the circuit board. Within the dielectric material and more specifically between both shielding layers some transmission lines 41 are arranged.

It is to be understood that the circuit board including: the shielding layer, the dielectric material and the transmission lines enclosed therein, can be processed by various techniques. For example, a bottom layer of dielectric material representing the bottom of body 7 is provided and a first metal layer forming the second shielding layer 52 is deposited thereon. Then, further dielectric material is deposited on the second shielding layer 52 and some transmission lines 41 are deposited on top of the dielectric material via, i.e., photolithography. The transmission lines 41 are then enclosed by further dielectric material. The process is repeated until the desired structure is provided. On the surface of such material, the first shielding layer 51 is then deposited. Such deposition of metal layers and/or transmission lines are provided via, i.e., chemical vaporization, vacuum deposition or any other process, in which a metal layer on a planar surface of dielectric material is provided. Furthermore, vias through the shielding layer as well as the dielectric material are produced to contact the transmission lines 41.

When the basic circuit board structure is finished, the edges on the upper side of the body 7 are removed, thereby uncovering brink portions of the first shielding layer 51. For such removal process the edges may be cut or grinded off. A chemical etch process with photolithographic means can also be used.

Figure 4A:
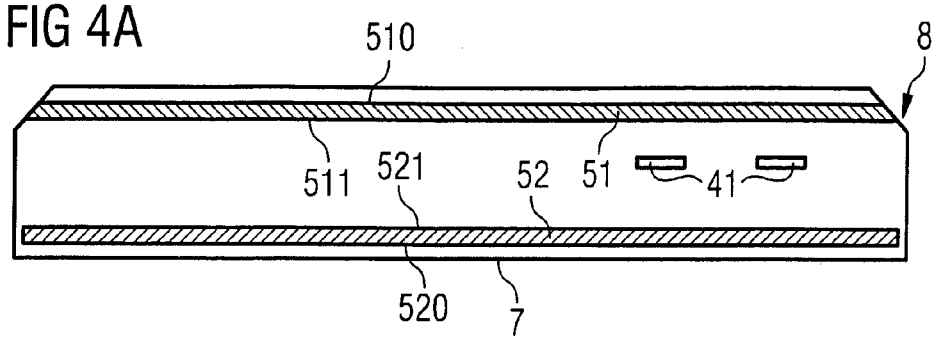
FIGS. 4a to 4d show block diagrams illustrating a shielded circuit board in different processing steps according an embodiment of the present invention.
Figure 4B:
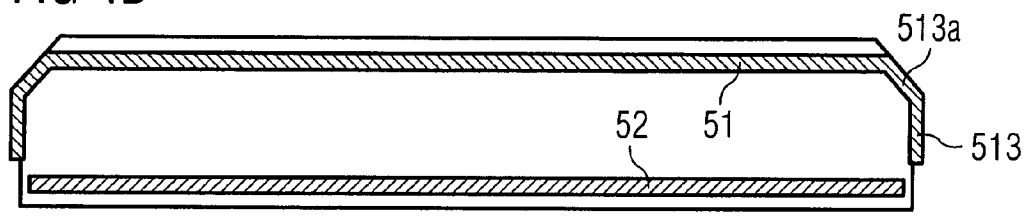
Figure 4C:
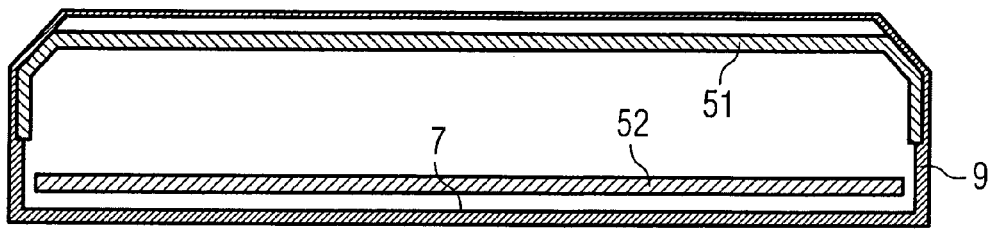

After the removal process a metal is deposited on the sidewalls and the inclined area of body 7 as seen on FIG. 4B. The metal layer 513 on the sidewall and the slanted area 513a form the third shielding layer and are in conductive connection with the first shielding layer 51. The layer 513 on the sidewall does not extend to the bottom of shielding layer 52. Then, a dielectric material 9 is deposited on body 7 and on the surface of the third shielding layer 513 including the slanted area 513a as seen in FIG. 4C. The dielectric material 9 may be different from the dielectric material forming the body 7. Of course, a similar dielectric material or even the same material can be used for this purpose.

Figure 4D:
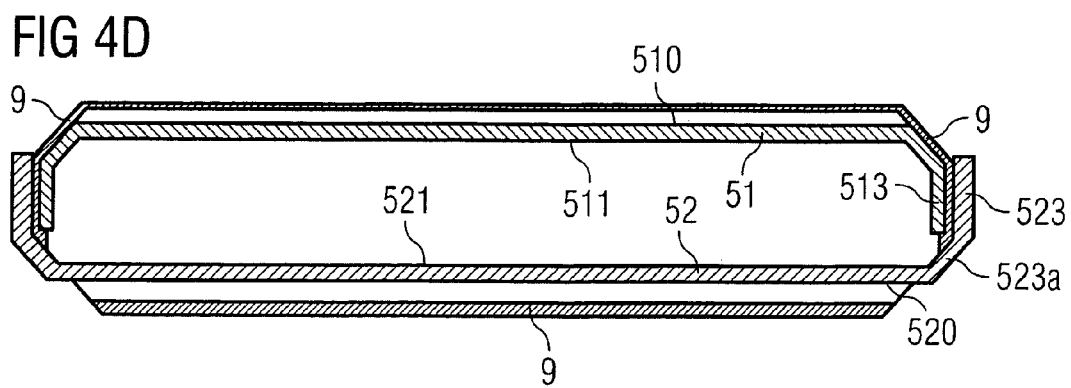
Figure 5:
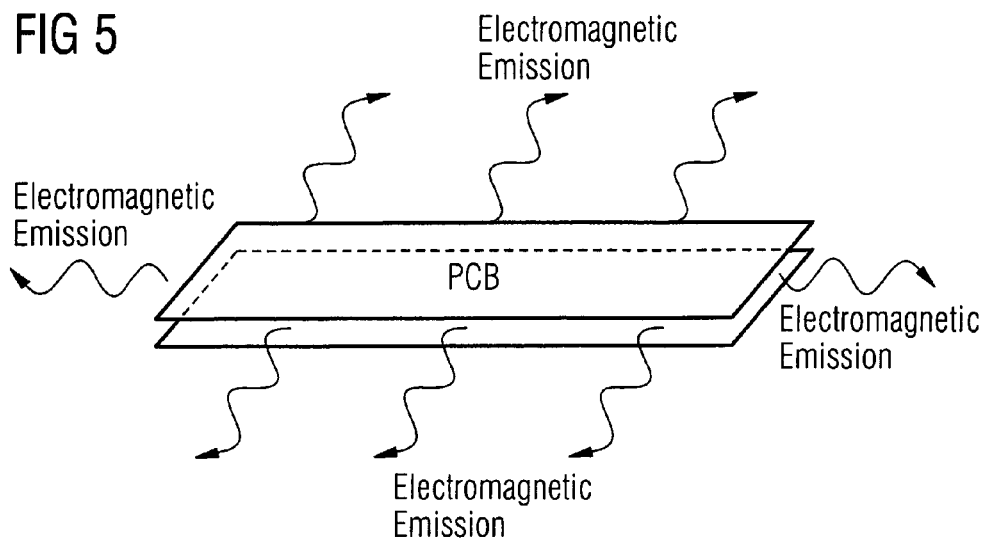
FIG. 5 shows a block diagram of a shielded circuit board radiating electromagnetic energy to illustrate by way of example the aspect of electromagnetic interference.

In FIG. 4D the edges of the lower part of body 7 are removed, thereby uncovering the brinks of the second shielding layer 52. The uncovering process removes the dielectric material 9 and a portion of body 7, but still leaves some dielectric material 9 in the area of the third shielding layer 513 intact. In other words, the shielding layer 513 will not be uncovered by the removal process, but still be enclosed by the dielectric material 9. After the removal process, the fourth shielding layers 523 and 523a are deposited. As a result, a third and fourth shielding layers enclose the sidewall of body 7 while being separated by a very thin layer of dielectric material 9 and being in connection to the respective first and second shielding layer 51 and 52. The remaining dielectric material can be removed if necessary or be further used to deposit additional transmission lines thereon.

In a different embodiment, the first shielding layer 51 is deposited on the first main surface area of dielectric material forming the body 7, while the second shielding layer 52 is deposited on the second main surface. In this embodiment the two shielding layers form substantially parallel areas, which enclose the top and bottom side of body 7 of the circuit board. However, no additional dielectric material is deposited on top of the two shielding layers, leaving the layers intact. Then, the third shielding layer is deposited directly on the sidewalls and connected to the first shielding layer 51. It is understood that a third shielding layer is not conductively connected to the second shielding layer. This can be achieved by disposing the third shielding layer 513 not across the whole width of body 7, but leaving some small area on the sidewall near the second shielding layer uncovered.

Then, the second dielectric material 9 is deposited on body 7 and first and second shielding layers. At the bottom edges of body 7, the second dielectric material 9 is removed to uncover the second shielding layer 52. Finally, the fourth shielding layer is deposited on the dielectric material on the sidewalls while being in conductive connection to the second shielding layer. The remaining second dielectric material on top of the first and second shielding layers can be used as base for depositing further transmission lines.

In a different embodiment, the body 7 can be provided without depositing both main shielding layers. For example the first shielding layer including the portion on the sidewall can be provided and enclosed by dielectric material. On top of the dielectric material on the sidewalls and on the remaining surface of body 7 the second shielding layer can be provided.

With the new structure a shielded circuit board is provided capable for high-speed and high-frequency applications. The shielded circuit board provides a very effective decoupling capacitor for signal frequencies above 1 GHZ and also reduces the electromagnetic energy emitted from transmission lines of the shielded circuit board in each direction. The first and second shielding layer, substantially parallel to the main surfaces of the circuit board and normally used as power and ground planes overlap on the sidewall of the shielded circuit board with a very short distance. This overlap is achieved by providing third and fourth shielding layers separated by a small layer of dielectric material. With those overlapping areas the shielded circuit board provides a very effective power and signal integrity decoupling at high frequencies.

While the invention has been described in detail and with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A shielded circuit board, comprising:
   a first metal layer including a first surface area, a first portion, and a second portion;
   a second metal layer including a first portion, a first surface area and a second surface area opposing the first surface area of the second metal layer; and
   at least one signal transmission line disposed in a first dielectric material, wherein the at least one signal transmission line separates the first portion of the first metal layer from the first portion of the second metal layer;
   wherein the first surface area of the second metal layer and the first surface area of the first metal layer that is disposed in the first portion of the first metal layer face toward each other, and the second surface area of the second metal layer and the first surface area of the first metal layer that is disposed in the second portion of the first metal layer face toward each other.

2. The shielded circuit board of claim 1, wherein the first dielectric material encloses the first portion of the first metal layer and the first portion of the second metal layer.

3. The shielded circuit board of claim 1, wherein the first and second portions of the first metal layer are arranged to form an angle therebetween.

4. The shielded circuit board of claim 3, wherein at least parts of the first and second portions of the first metal layer are perpendicular to each other.

5. The shielded circuit board of claim 1, wherein the first metal layer and the second metal layer are arranged substantially parallel to each other.

6. The shielded circuit board of claim 1, further comprising:
   at least one second transmission line that faces the second surface of the first metal layer and is separated from the first metal layer by a second dielectric material.

7. The shielded circuit board of claim 6, wherein the second dielectric material is the same as the first dielectric material.

8. The shielded circuit board of claim 1, further comprising:
   a third dielectric material that is arranged in the second portion of the first metal layer between the first surface area of the first metal layer and the second surface area of the second metal layer.

9. The shielded circuit board of claim 8, wherein the third dielectric material is the same as the first dielectric material.

10. A shielded circuit board, comprising:
    a first metal layer comprising first and second portions;
    a second metal layer comprising first and second portions;
    a first dielectric material that separates the first portions of the first and second metal layers; and
    at least one signal transmission line arranged in the first dielectric material between the first portions of the first and second metal layers;
    wherein the second portion of the first metal layer is disposed at least partially across at least one side surface of the first dielectric material, the second portion of the second metal layer is disposed, non-conductively, at least partially across the second portion of the first metal layer, and the first and second metal layers are separated from each other.

11. The shielded circuit board of claim 10, further comprising:
    a second dielectric material that is arranged between the second portion of the first metal layer and the second portion of the second metal layer.

12. The shielded circuit board of claim 11, wherein the second dielectric material has a dielectric constant that is different than a dielectric constant of the first dielectric material.

13. The shielded circuit board of claim 10, wherein the second portion of the first metal layer is arranged substantially parallel to the second portion of the second metal layer.

14. The shielded circuit board of claim 10, wherein the first portion of the first metal layer includes a sub-portion, the second portion of the first metal layer includes a sub-portion, and the sub-portions of the first and second portions of the first metal layer are at least partially perpendicular to each other.

15. The shielded circuit board of claim 14, further comprising:
at least one second transmission line that is disposed in an area of the first portion of the first metal layer.

16. The shielded circuit board of claim 10, wherein the first portions of the first and second metal layers are enclosed by the first dielectric material.

17. The shielded circuit board of claim 10, further comprising:
a coating layer that encloses at least the first dielectric material and the first and second portions of the first and second metal layers.

18. A shielded circuit board, comprising:
a first dielectric material;
at least one signal transmission layer including at least one sidewall and at least one signal transmission line enclosed in the first dielectric material;
a first shielding layer forming a power plane and a second shielding layer forming a ground plane, wherein the first and second shielding layers are arranged substantially parallel to each other and separated by the at least one signal transmission layer;
a third shielding layer provided on a sidewall of the at least one signal transmission layer;
a second dielectric material disposed on the third shielding layer, wherein the second dielectric material has a dielectric constant that differs from a dielectric constant of the first dielectric material; and
a fourth shielding layer disposed on the second dielectric material.

19. The shielded circuit board of claim 18, wherein the third shielding layer comprises a conductive connection to the first shielding layer, and the fourth shielding layer comprises a conductive connection to the second shielding layer.

20. The shielded circuit board of claim 18, further comprising:
a coating layer that encloses the first, second, third and fourth shielding layers.

21. The shielded circuit board of claim 18, further comprising:
a second signal transmission layer including at least one second signal transmission line enclosed in a third dielectric material, wherein the second signal transmission layer is disposed on one of the first and second shielding layers.

22. The shielded circuit board of claim 18, wherein at least two of the first, second and third dielectric materials comprise the same material.

23. A method for shielding a circuit board, comprising:
providing a shielded circuit board including a first shielding layer, a second shielding layer, and at least one signal transmission layer disposed between the first and second shielding layers, wherein the at least one signal transmission layer includes a sidewall and a first dielectric material;
depositing a third shielding layer onto the sidewall of the at least one signal transmission layer, wherein the third shielding layer is in conductive connection with the first shielding layer;
depositing a second dielectric material onto the third shielding layer, wherein the second dielectric material has a dielectric constant that differs from a dielectric constant of the first dielectric material; and
depositing a fourth shielding layer onto the second dielectric material, wherein the fourth shielding layer is in conductive connection with the second shielding layer.

24. The method of claim 23, wherein the first and second shielding layers are enclosed by the first dielectric material.

25. The method of claim 23, wherein the depositing of the third shielding layer comprises:
removing a lateral edge of the first dielectric material so as to uncover part of the first shielding layer; and
depositing a metallization layer onto the sidewall of the at least one signal transmission layer and onto the uncovered part of the first shielding layer.

26. The method of claim 23, wherein the depositing of the fourth shielding layer comprises:
removing a lateral edge of the second dielectric material and of the first dielectric material so as to uncover part of the second shielding layer; and
depositing a metallization layer onto the second dielectric material and onto the uncovered part of the second shielding layer.

27. The method of claim 23, further comprising:
depositing a second signal transmission layer on top of at least the first shielding layer.

* * * * *